(12) United States Patent
Khandelwal et al.

(10) Patent No.: US 11,601,123 B1
(45) Date of Patent: Mar. 7, 2023

(54) POWER-ON RESET (POR) CIRCUIT

(71) Applicant: NXP B.V., Eindhoven (NL)

(72) Inventors: Shubham Ajaykumar Khandelwal, Eindhoven (NL); Henricus Cornelis Johannes Büthker, Mierlo (NL); Hendrik Johannes Bergveld, Eindhoven (NL)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 17/523,798

(22) Filed: Nov. 10, 2021

(51) Int. Cl.
*H03K 17/22* (2006.01)

(52) U.S. Cl.
CPC ..... *H03K 17/223* (2013.01); *H03K 2017/226* (2013.01); *H03K 2217/0036* (2013.01)

(58) Field of Classification Search
None
See application file for complete search history.

(56) References Cited

U.S. PATENT DOCUMENTS

| | | | |
|---|---|---|---|
| 4,885,476 A | 12/1989 | Mahabadi | |
| 4,970,408 A | 11/1990 | Hanke et al. | |
| 5,528,184 A | 6/1996 | Gola et al. | |
| 6,005,423 A * | 12/1999 | Schultz | H03K 17/223 327/143 |
| 6,141,764 A | 10/2000 | Ezell | |
| 7,199,623 B2 * | 4/2007 | Kwon | H03K 17/223 327/143 |
| 7,295,050 B2 * | 11/2007 | Shin | H03K 17/223 327/143 |
| 7,432,748 B2 | 10/2008 | Khan et al. | |
| 7,873,856 B2 | 1/2011 | Westwick et al. | |
| 8,242,817 B2 | 8/2012 | Yamamoto et al. | |
| 8,680,901 B2 | 3/2014 | Shrivastava et al. | |
| 8,692,593 B1 * | 4/2014 | Zhang | G06F 1/30 327/143 |
| 8,754,680 B2 | 6/2014 | Xiao et al. | |
| 9,143,027 B2 | 9/2015 | Wright | |
| 10,193,545 B1 * | 1/2019 | Pankratz | H03K 5/2472 |
| 10,790,806 B2 * | 9/2020 | Shreepathi Bhat | H03K 17/223 |

OTHER PUBLICATIONS

Wadha, Sanjay Kumar et al; "Zero Steady State Current Power-on-Reset Circuit with Brown-Out Detector"; IEEE 19th Intl Conf. on VLSI Design held jointly with 5th Intl Conf. on Embedded Systems Design; (2006), 6 pages.

* cited by examiner

*Primary Examiner* — Jeffery S Zweizig

(57) ABSTRACT

Embodiments of power-on reset (POR) circuits are described. In one embodiment, a POR circuit includes a primary ladder circuit connected to a supply voltage and configured to generate a reference signal for a reset signal in response to the supply voltage and a secondary ladder circuit connected to the supply voltage and configured to bias the primary ladder circuit in response to the supply voltage.

14 Claims, 5 Drawing Sheets

POWER-ON RESET (POR) CIRCUIT

BACKGROUND

An input supply circuit can be used to provide an input voltage to one or more components of a device, such as an integrated circuit (IC). When an input voltage is applied to a device, such as, a semiconductor device, the device is typically needed to be in a known state, for example, to deal with an unstable voltage. A power-on reset (POR) circuit can be used to reset or initiate a device, such as, a semiconductor device when an input voltage is applied to the device. Typically, a POR circuit needs to support a wide range of supply voltage, for example, in case of multiple voltage supply domains. In addition, a POR circuit typically needs to keep a low circuit area to satisfy circuit design requirements and/or to reduce circuit manufacturing costs. Furthermore, in a POR circuit, it is typically desirable to have a low quiescent current draw in order to reduce power consumption. Therefore, there is a need for a POR circuit that can support a wide range of supply voltage, keep a low circuit area, and exhibit a low quiescent current draw.

SUMMARY

Embodiments of a POR circuit are described. In one embodiment, a POR circuit includes a primary ladder circuit connected to a supply voltage and configured to generate a reference signal for a reset signal in response to the supply voltage and a secondary ladder circuit connected to the supply voltage and configured to bias the primary ladder circuit in response to the supply voltage. Other embodiments are also described.

In an embodiment, the secondary ladder circuit is configured to bias the primary ladder circuit as a current source when the supply voltage is higher than a voltage threshold.

In an embodiment, the secondary ladder circuit is configured to bias the primary ladder circuit as a switch when the supply voltage is lower than a voltage threshold.

In an embodiment, the primary ladder circuit includes a first transistor connected to the supply voltage and diode-connected transistors connected to the first transistor.

In an embodiment, the secondary ladder circuit is configured to bias the first transistor of the primary ladder circuit as a current source when the supply voltage is higher than a voltage threshold.

In an embodiment, the secondary ladder circuit is configured to bias the first transistor of the primary ladder circuit as a switch when the supply voltage is lower than a voltage threshold.

In an embodiment, the first transistor of the primary ladder circuit includes a metal-oxide-semiconductor field-effect transistor (MOSFET) transistor or a bipolar junction transistor (BJT).

In an embodiment, the diode-connected transistors of the primary ladder circuit include MOSFET transistors or BJTs.

In an embodiment, the secondary ladder circuit includes a plurality of diode-connected transistors.

In an embodiment, the diode-connected transistors of the secondary ladder circuit include MOSFET transistors or BJTs.

In an embodiment, the POR circuit further includes a reference circuit connected to the supply voltage.

In an embodiment, the POR circuit further includes a comparator connected to the supply voltage.

In an embodiment, the comparator is configured to compare an output voltage of the secondary ladder circuit with a first voltage in the reference circuit to generate a comparison result signal.

In an embodiment, the POR circuit further includes a buffer circuit connected to the supply voltage and between the comparator and the primary ladder circuit.

In an embodiment, the buffer circuit is configured to generate a buffered signal to a transistor of the primary ladder circuit based on the comparison result signal and a second voltage in the reference circuit.

In an embodiment, a power-on reset (POR) circuit include a primary ladder circuit connected between a first supply voltage and a second supply voltage and configured to generate a reference signal for a reset signal in response to the first supply voltage and the second supply voltage and a secondary ladder circuit connected between the first supply voltage and the second supply voltage and configured to bias the primary ladder circuit in response to at least one of the first supply voltage and the second supply voltage.

In an embodiment, the POR circuit further includes a reference circuit connected to the first and second supply voltages.

In an embodiment, the POR circuit further includes a comparator connected to the first and second supply voltages.

In an embodiment, the POR circuit further includes a buffer circuit connected to the first and second supply voltages and between the comparator and the primary ladder circuit.

In an embodiment, a POR circuit includes a primary ladder circuit connected to a supply voltage and configured to generate a reference signal for a reset signal in response to the supply voltage reaching a first defined voltage trip level; and a secondary ladder circuit connected to the supply voltage and configured to bias the primary ladder circuit in response to the supply voltage reaching a second defined voltage trip level.

Other aspects and advantages of embodiments of the present invention will become apparent from the following detailed description, taken in conjunction with the accompanying drawings, depicted by way of example of the principles of the invention.

BRIEF DESCRIPTION OF THE DRAWINGS

Throughout the description, similar reference numbers may be used to identify similar elements.

DETAILED DESCRIPTION

It will be readily understood that the components of the embodiments as generally described herein and illustrated in the appended figures could be arranged and designed in a wide variety of different configurations. Thus, the following detailed description of various embodiments, as represented in the figures, is not intended to limit the scope of the present disclosure, but is merely representative of various embodiments. While the various aspects of the embodiments are presented in drawings, the drawings are not necessarily drawn to scale unless specifically indicated.

The described embodiments are to be considered in all respects only as illustrative and not restrictive. The scope of the invention is, therefore, indicated by the appended claims rather than by this detailed description. All changes which come within the meaning and range of equivalency of the claims are to be embraced within their scope.

Reference throughout this specification to features, advantages, or similar language does not imply that all of the features and advantages that may be realized with the present invention should be or are in any single embodiment. Rather, language referring to the features and advantages is understood to mean that a specific feature, advantage, or characteristic described in connection with an embodiment is included in at least one embodiment. Thus, discussions of the features and advantages, and similar language, throughout this specification may, but do not necessarily, refer to the same embodiment.

Furthermore, the described features, advantages, and characteristics of the invention may be combined in any suitable manner in one or more embodiments. One skilled in the relevant art will recognize, in light of the description herein, that the invention can be practiced without one or more of the specific features or advantages of a particular embodiment. In other instances, additional features and advantages may be recognized in certain embodiments that may not be present in all embodiments of the invention.

Reference throughout this specification to "one embodiment," "an embodiment," or similar language means that a particular feature, structure, or characteristic described in connection with the indicated embodiment is included in at least one embodiment. Thus, the phrases "in one embodiment," "in an embodiment," and similar language throughout this specification may, but do not necessarily, all refer to the same embodiment.

Figure 1:
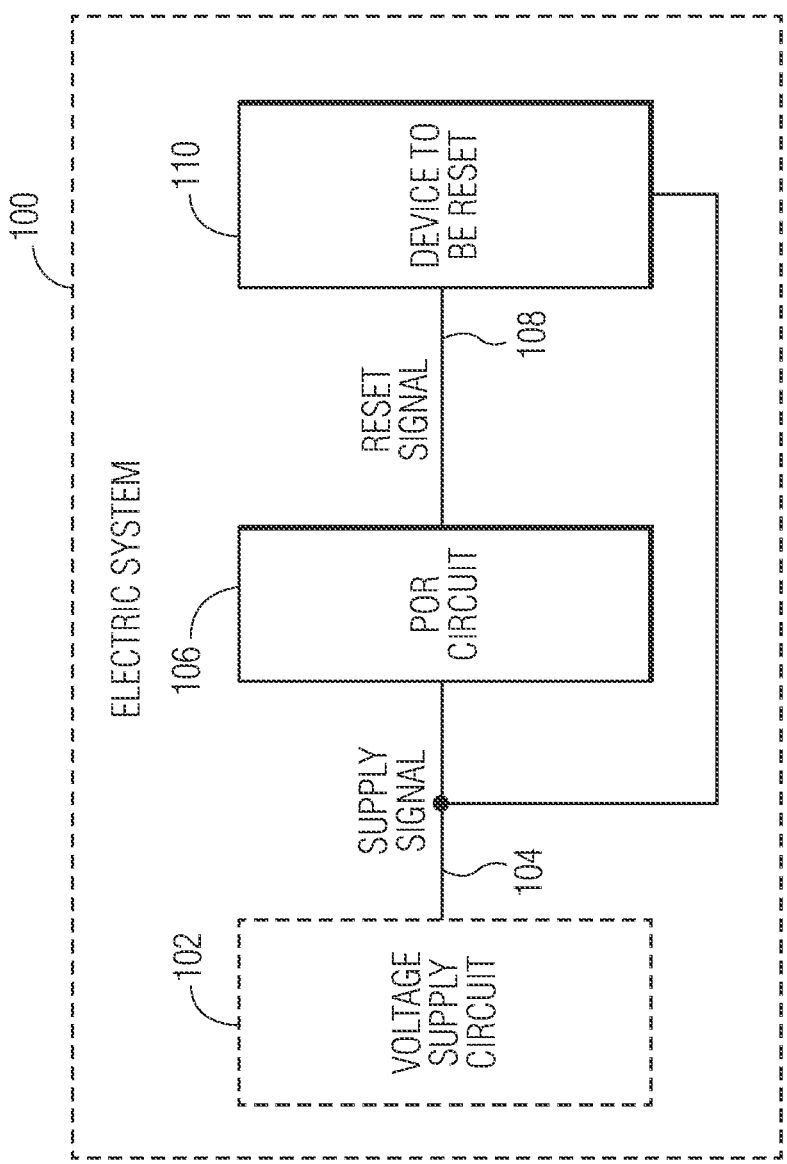
FIG. 1 is a schematic block diagram of an electric system in accordance with an embodiment of the invention.

FIG. 1 is a schematic block diagram of an electric system 100 in accordance with an embodiment of the invention. In the embodiment depicted in FIG. 1, the electric system 100 includes a voltage supply circuit 102, a POR circuit 106, and a device to be reset 110. Although the electric system 100 is shown in FIG. 1 as including certain components, in some embodiments, the electric system 100 includes less or more components to implement less or more functionalities. In some embodiments, the voltage supply circuit 102 is external to the electric system 100. For example, the POR circuit 106 and the device to be reset 110 is included in an IC chip and the voltage supply circuit 102 is external to the IC chip.

In the embodiment depicted in FIG. 1, the voltage supply circuit 102 is configured to generate a supply signal 104 having a supply voltage applied to the POR circuit 106 and the device to be reset 110, which may be an IC chip. The supply voltage that is generated by the voltage supply circuit can be any suitable type of Direct Current (DC) voltage. The voltage supply circuit can be used to provide an operating voltage for components of an IC. In some embodiments, the voltage supply circuit supports multiple voltage supply domains and generates a wide range of supply voltage. For example, the voltage supply circuit may generate a first voltage around 1.5 volts and a second voltage around 3.3 volts. The voltage supply circuit may be a battery, a generator, a wall plug, or other possible type of power source.

In some embodiments, the voltage supply circuit is a battery having a voltage of, for example, 1.5 volts or 3.3 volts. For example, the voltage supply circuit may be a low-voltage (LV) battery, for example, a primary coin cell or a silver-oxide battery having a voltage, $V_{BAT\_LV}$, less than or equal to 1.6V or a high-voltage (HV) battery such as a Li-ion battery having a voltage, $V_{BAT\_HV}$, less than or equal to 3.6V.

In the embodiment depicted in FIG. 1, the POR circuit 106 is configured to reset (e.g., pre-set or pre-reset) or initiate the device to be reset 110, such as, a semiconductor device when the supply signal 104 having a supply voltage is applied to the device to be reset 110. For example, when the supply voltage is unstable, it can be difficult to interpret supply voltage level. Consequently, when the supply voltage is applied to a device (e.g., the device to be reset 110) during power-up, the device (e.g., the device to be reset 110), may require initialization. For example, the device to be reset 110, which can be a load device containing semiconductor memory device, a flip-flop, a latch, a register, or a counter, memory devices, may hold or contain signals in the form of digital or binary levels such as logic '0' and logic '1'. Consequently, the device to be reset 110 or a component (e.g., a flipflop) of the device to be reset 110 is typically needed to be in a known state, for example, in a logic '1' state or a logic '0' state, when the supply signal 104 having a supply voltage is applied to the device to be reset 110. For example, the POR circuit can be used to ensure that when the supply signal 104 has a proper value for the electric system 100 to start (e.g., above a trip level), e.g., by resetting the device to be reset 110 such that the device to be reset 110 can start from a known state. In some embodiments, the POR circuit 106 is configured to generate a reset signal 108 for the device to be reset 110 in response to the supply voltage of the supply signal 104 reaching or exceeding a reference voltage level above which the device to be reset 110 can operate. For example, the POR circuit 106 is configured to generate a POR pulse to pre-set or pre-reset one or more components of the device to be reset 110 (e.g., a semiconductor memory device, a flip-flop, a latch, a register, or a counter). In some embodiments, the POR circuit 106 and the device to be reset 110 are included in an IC chip and the POR pulse is generated on-chip. The POR circuit 106 can support a wide range of supply voltage, keep a low circuit area, and exhibit a low quiescent current draw.

Figure 2:
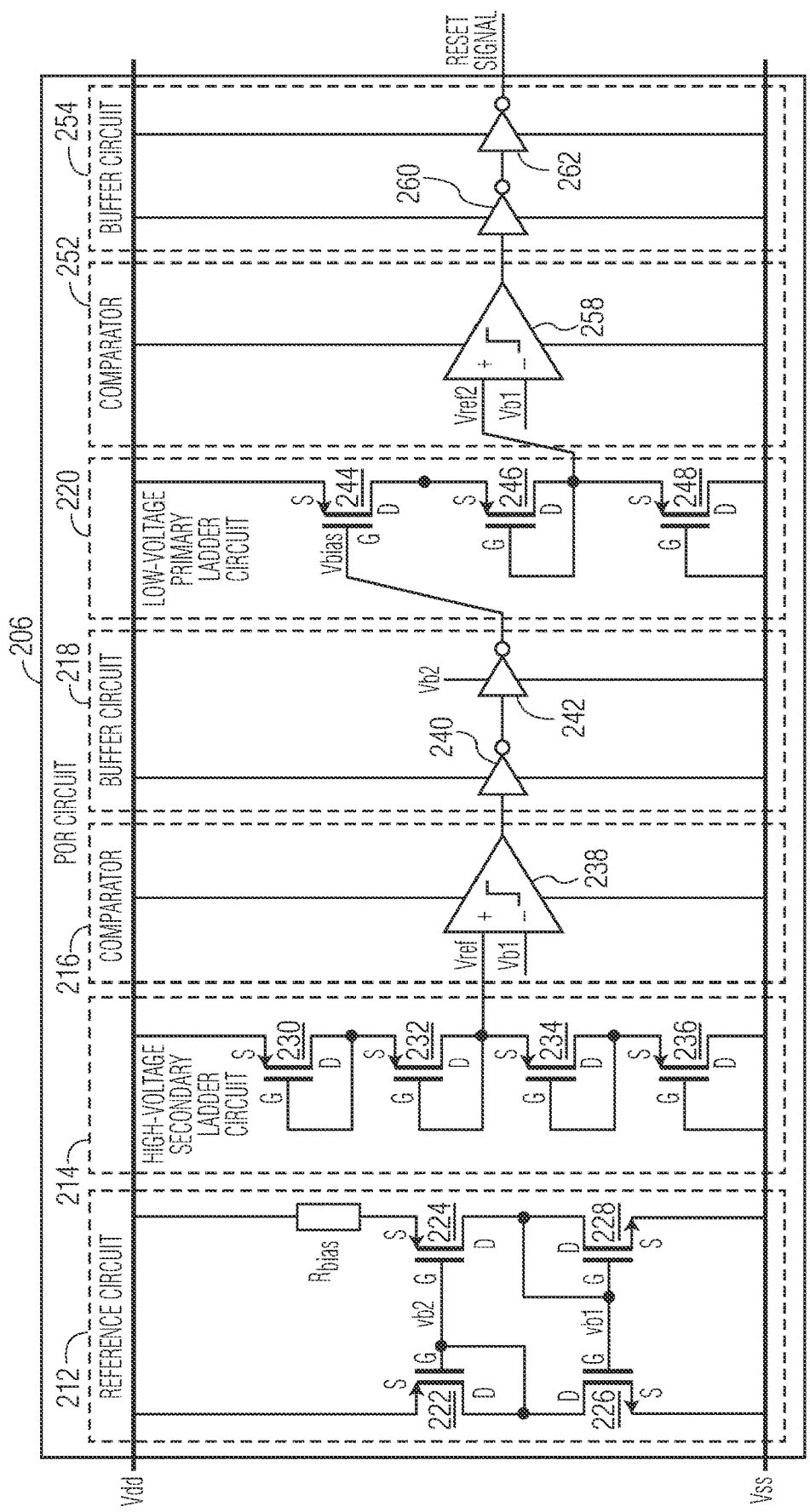
FIG. 2 depicts a POR circuit in accordance with an embodiment of the invention.

FIG. 2 depicts a POR circuit 206 in accordance with an embodiment of the invention. The POR circuit 206 depicted in FIG. 2 is an embodiment of the POR circuit 106 depicted in FIG. 1. However, the POR circuit 106 depicted in FIG. 1 is not limited to the embodiment shown in FIG. 2. In the embodiment depicted in FIG. 2, the POR circuit 206 includes a reference circuit 212, a high-voltage secondary ladder circuit 214, a comparator 216, a buffer circuit 218, a low-voltage primary ladder circuit 220, a second comparator 252, and a second buffer circuit 254. Although the POR circuit 206 is shown in FIG. 2 as including certain components, in some embodiments, the POR circuit 206 includes less or more components to implement less or more functionalities. For example, although the reference circuit 212, the high-voltage secondary ladder circuit 214, and the low-voltage primary ladder circuit 220 are shown in FIG. 2 as including specific types and/or combinations of semiconductor devices, in other embodiments, the reference circuit 212, the high-voltage secondary ladder circuit 214, and/or the low-voltage primary ladder circuit 220 may include different types and/or combinations of semiconductor devices. For example, the reference circuit 212, the high-voltage secondary ladder circuit 214, and/or the low-voltage primary ladder circuit 220 may be implemented using bipolar junction transistors (BJTs) such as PNP transistors, NPN transistors, electron tubes and/or any other suitable semiconductor devices.

In the embodiment depicted in FIG. 2, the reference circuit 212 includes two P-channel metal-oxide-semiconductor field-effect transistor (MOSFET) (PMOS) transistors 222, 224, two N-channel MOSFET (NMOS) transistors 226, 228, and a bias resistor, $R_{BIAS}$. The source terminal, S, of the PMOS transistor 222 is connected to a positive supply voltage, $V_{DD}$, the gate terminal, G, of the PMOS transistor 222 is connected to the gate terminal, G, of the PMOS transistor 224, and the drain terminal, D, of the PMOS transistor 222 is connected to the drain terminal, D, of the NMOS transistor 226, as well as to its own gate terminal G. The source terminal, S, of the PMOS transistor 224 is connected to the positive supply voltage, $V_{DD}$, through the bias resistor, $R_{BIAS}$, the gate terminal, G, of the PMOS transistor 224 is connected to the gate terminal, G, of the PMOS transistor 222, and the drain terminal, D, of the PMOS transistor 224 is connected to the drain terminal, D, of the NMOS transistor 228. The source terminal, S, of the NMOS transistor 226 is connected to a lower supply voltage, $V_{SS}$, which is lower than the positive supply voltage, $V_{DD}$, and may be, for example, ground (zero volt), the gate terminal, G, of the NMOS transistor 226 is connected to the gate terminal, G, of the NMOS transistor 228, and the drain terminal, D, of the NMOS transistor 226 is connected to the drain terminal, D, of the PMOS transistor 222. The source terminal, S, of the NMOS transistor 228 is connected to the lower supply voltage, $V_{SS}$, the gate terminal, G, of the NMOS transistor 228 is connected to the gate terminal, G, of the NMOS transistor 226, and the drain terminal, D, of the NMOS transistor 228 is connected to the drain terminal, D, of the PMOS transistor 224, as well as to its own gate terminal G.

In the embodiment depicted in FIG. 2, the high-voltage secondary ladder circuit 214 includes four PMOS transistors 230, 232, 234, 236 that are serially connected between the positive supply voltage, $V_{DD}$, and the lower voltage, $V_{SS}$, which may be, for example, ground (zero volt). The source terminal, S, of the PMOS transistor 230 is connected to the positive supply voltage, $V_{DD}$, and the gate terminal, G, of the PMOS transistor 230 is connected to the source terminal, S, of the PMOS transistor 232, and the drain terminal, D, of the PMOS transistor 230. The gate terminal, G, of the PMOS transistor 232 is connected to the source terminal, S, of the PMOS transistor 234, and the drain terminal, D, of the PMOS transistor 232. The gate terminal, G, of the PMOS transistor 234 is connected to the source terminal, S, of the PMOS transistor 236, and the drain terminal, D, of the PMOS transistor 234. The gate terminal, G, of the PMOS transistor 236 is connected to the lower voltage, $V_{SS}$, and the drain terminal, D, of the PMOS transistor 236. The high-voltage secondary ladder circuit is configured to control the bias of the low-voltage primary ladder circuit 220 in response to at least one of the positive supply voltage, $V_{DD}$, and the lower voltage, $V_{SS}$. In some embodiments, the trip level of the high-voltage secondary ladder circuit 214 is chosen or set such that the trip level is above the supply level of the voltage supply circuit, when supplied by a low-voltage battery, e.g., above 1.5V. In these embodiments, when a high-voltage battery is connected, the same low threshold (0.8V for example) is detected by the primary ladder circuit, and as soon as the supply input voltage rises above the second threshold (since it is a high-voltage battery instead of a low-voltage battery), the low-voltage primary ladder circuit 220 is switched to reduce its current.

In the embodiment depicted in FIG. 2, the comparator 216 includes a comparator circuit 238 connected between the positive or supply voltage, $V_{DD}$, and the lower voltage, $V_{SS}$, which may be, for example, ground (zero volt). The comparator 216 is configured to compare a reference voltage, $V_{REF}$, at the drain terminal, D, and the gate terminal, G, of the PMOS transistor 232 and the source terminal, S, of the PMOS transistor 234, and a voltage, $V_{B1}$, at the gate terminals, G, of the NMOS transistors, 226, 228, and the drain terminal, D, of the NMOS transistor 228, to generate a comparison result signal.

In the embodiment depicted in FIG. 2, the buffer circuit 218 includes two inverters 240, 242 connected between the comparator 216 and the low-voltage primary ladder 220 and configured to generate a buffered signal to a transistor of the low-voltage primary ladder circuit 220 based on a comparison result signal from the comparator 216. The inverter 240 is connected between the positive or supply voltage, $V_{DD}$, and the lower voltage, $V_{SS}$, which may be, for example, ground (zero volt), and is configured to generate an inverted version of the comparison result signal generated by the comparator 216. The inverter 242 is connected between the voltage, $V_{B2}$, at the gate terminals, G, of the PMOS transistors 222, 224 and the drain terminals, D, of the PMOS transistor 222 and the NMOS transistor 226 and the lower voltage, $V_{SS}$, and is configured to generate a scaled-down buffered version of the comparison result signal generated by the comparator 216.

In the embodiment depicted in FIG. 2, the low-voltage primary ladder circuit 220 is a diode-connected metal-oxide-semiconductor (MOS) ladder that includes three PMOS transistors 244, 246, 248 that are serially connected between the positive supply voltage, $V_{DD}$, and the lower voltage, $V_{SS}$, which may be, for example, ground (zero volt). The source terminal, S, of the PMOS transistor 244 is connected to the positive supply voltage, $V_{DD}$, and the gate terminal, G, of the PMOS transistor 244 is connected to a voltage, $V_{BIAS}$, at the output of the buffer circuit 218 (e.g., the output of the inverter 242 of the buffer circuit 218), and the drain terminal, D, of the PMOS transistor 244 is connected to the source terminal, S, of the PMOS transistor 246. The gate terminal, G, of the PMOS transistor 246 is connected to the source terminal, S, of the PMOS transistor 248, and the drain terminal, D, of the PMOS transistor 246. The gate terminal, G, of the PMOS transistor 248 is connected to the lower voltage, $V_{SS}$, and the drain terminal, D, of the PMOS transistor 248. The low-voltage primary ladder circuit 220 is configured to sense the positive supply voltage, $V_{DD}$, to generate a reference voltage, $V_{REF2}$, (different from the reference voltage, $V_{REF}$, which is generated by the high-voltage secondary ladder circuit 214), which is compared to the voltage, $V_{B1}$, in the next comparator 252 to generate the reset signal. The comparator 252 defines the trip level to generate the POR reset output signal and the buffer circuit 254 generates the POR reset output signal.

In the embodiment depicted in FIG. 2, the comparator 252 includes a comparator circuit 258 connected between the positive or supply voltage, $V_{DD}$, and the lower voltage, $V_{SS}$, which may be, for example, ground (zero volt). The comparator 252 is configured to compare the reference voltage, $V_{REF2}$, at the drain terminal, D, and the gate terminal, G, of the PMOS transistor 246 and the source terminal, S, of the PMOS transistor 248, and the voltage, $V_{B1}$, at the gate terminals, G, of the NMOS transistors, 226, 228, and the drain terminal, D, of the NMOS transistor 228, to generate a comparison result signal.

In the embodiment depicted in FIG. 2, the buffer circuit 254 includes two inverters 260, 262 connected between the positive or supply voltage, $V_{DD}$, and the lower voltage, $V_{SS}$, which may be, for example, ground (zero volt), and configured to generate a reset signal based on a comparison result signal from the comparator 252. The inverter 260 is connected between the positive or supply voltage, $V_{DD}$, and the lower voltage, $V_{SS}$, and is configured to generate an inverted version of the comparison result signal generated by the comparator 252. The inverter 262 is connected between the positive or supply voltage, $V_{DD}$, and the lower voltage, $V_{SS}$, and is configured to generate the reset signal.

In some embodiments, one or more of the PMOS transistors 230, 232, 234, 236, 244, 246, 248 of the high-voltage secondary ladder circuit 214 and the low-voltage primary ladder circuit 220 are implemented in PNP transistors. In some embodiments, one or more of the NMOS transistors 226, 228 of the reference circuit 212 are implemented in NPN transistors.

In low-substrate-area POR designs, a diode-connected MOS ladder can be used to generate a supply-voltage-dependent current source. However, due to the supply-voltage-dependency, the quiescent current of the MOS ladder can increase exponentially with the supply voltage. Optimizing the MOS ladder for high supply voltage is generally not an attractive option, given the accuracy requirement on POR trip voltage levels. For example, for a diode-connected MOS ladder, stacking diodes can compromise its functionality. Around the trip voltage level, the current in a diode-connected MOS ladder can be low if diodes are stacked to limit current at high voltages, which results in low accuracy at the low current that is flowing around the trip voltage level. In the POR circuit 206 depicted in FIG. 2, the secondary high-voltage ladder circuit 214 is used to generate a control signal to limit the current in the primary low-voltage ladder circuit 220. The POR circuit 206 is implemented as a low-area low-current POR that combines an accurate low threshold voltage (leading to POR output trip) detection with low current consumption even if the supply voltage goes up to higher voltage after start-up. In the embodiment depicted in FIG. 2, the POR circuit 206 uses the secondary high-voltage ladder circuit 214 to limit the current through the primary low-voltage ladder circuit 220 by changing the bias voltage, $V_{BIAS}$, of the PMOS transistor 244 in the primary low-voltage ladder circuit 220 from the linear region (the PMOS transistor 244 being biased as a switch) in the detection region to the saturation region (the PMOS transistor 244 being biased as a current source) at a higher supply voltage. The POR circuit 206 can be used in low-area applications in which the threshold or trip level is low (e.g., below 1 volt, such as around 0.8 volt or around 0.9 volt in a common silver-oxide battery use case), while potentially operating at high supply voltage (e.g., in case a high-voltage battery such as a Li-ion battery having a voltage, $V_{BAT\_HV}$, less than or equal to 3.6V is connected). Examples of the applications in which the POR circuit 206 can be used include, without being limited to, health-monitoring applications, Internet-of-Things (IoT) applications, and/or automotive switched-mode-power-supply (SMPS) applications.

In some embodiments, the current supply in the primary low-voltage ladder circuit 220 is limited when the positive supply voltage, $V_{DD}$, is higher than a voltage threshold (e.g., the highest battery voltage when the voltage supply circuit 102 is a low-voltage (LV) battery). For example, the voltage supply circuit may be a low-voltage (LV) battery, for example, a primary coin cell or a silver-oxide battery having a voltage, $V_{BAT\_LV}$, less than or equal to 1.5V. The PMOS transistor 244 in the primary low-voltage ladder 220 is biased as a switch as long as the positive supply voltage, $V_{DD}$, is lower than a voltage threshold (e.g., the highest battery voltage when the voltage supply circuit 102 is a low-voltage battery), for example, when the primary low-voltage ladder circuit 220 needs to detect an accurate trip level. By default, the PMOS transistor 244 in the primary low-voltage ladder 220 is biased as a switch, i.e., the bias voltage, $V_{BIAS}$, is equal to $V_{SS}$. In some embodiments, the PMOS transistor 244 in the primary low-voltage ladder circuit 220 is biased as a current source when the positive supply voltage, $V_{DD}$, is higher than a voltage threshold (e.g., the highest battery voltage when the voltage supply circuit 102 is a low-voltage battery). The high-voltage secondary ladder circuit 214 defines the transfer point and the comparator 216 determines whether $V_{BIAS}$ is equal to $V_{SS}$ (the PMOS transistor 244 is biased as a switch) or equal to $V_{B2}$ (the PMOS transistor 244 is biased as a current source). Compared to switching off the primary low-voltage ladder circuit 220, keeping the primary low-voltage ladder circuit 220 on by limiting its current results in reduced time of voltage sensing. For example, when the supply voltage deceases, it takes time for a switched-off POR circuit to turn on to sense the supply voltage.

Figure 3:
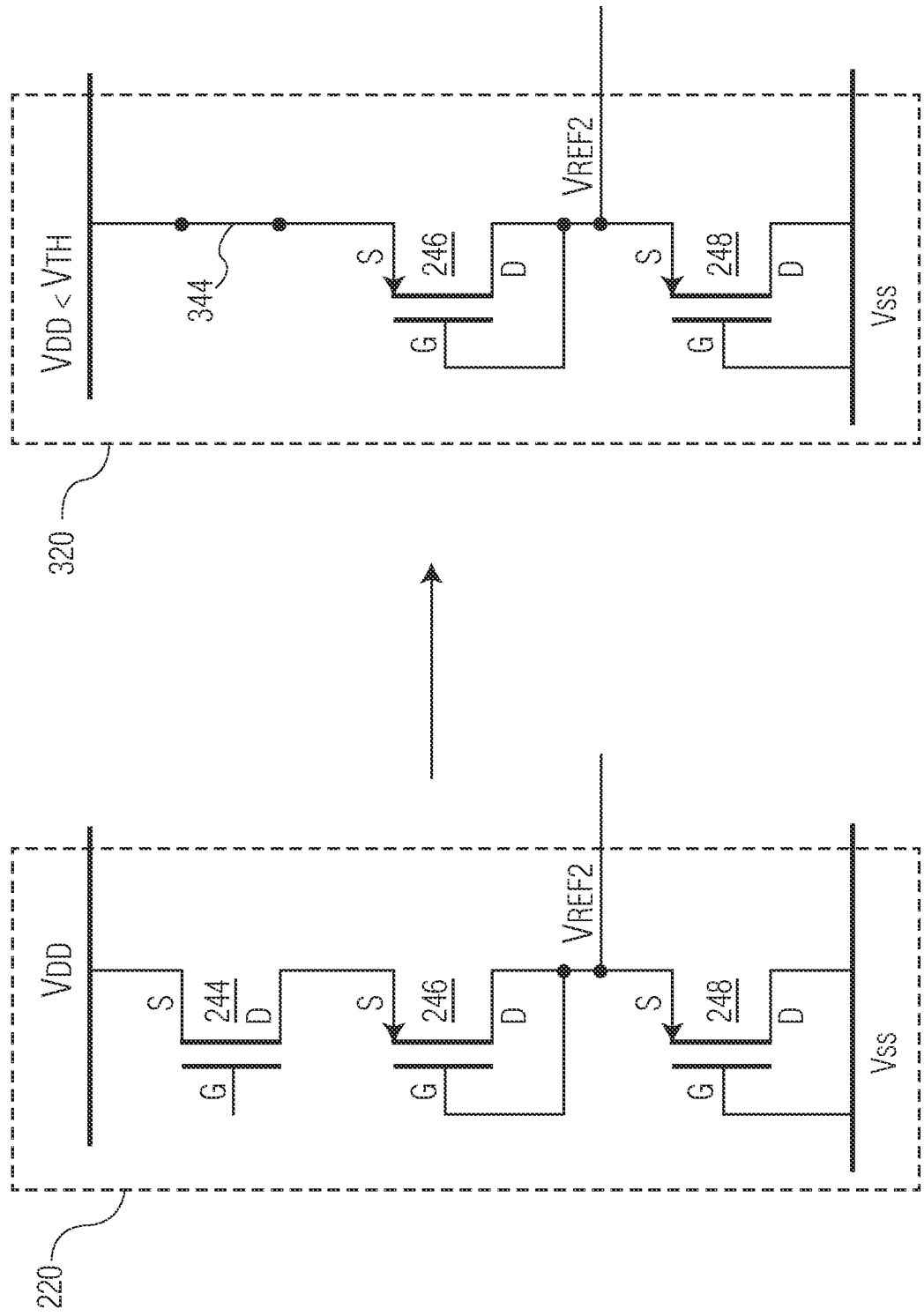
FIG. 3 depicts an operation of the POR circuit depicted in FIG. 2 when a positive supply voltage is lower than a predetermined voltage threshold.

FIG. 3 depicts an operation of the POR circuit 206 depicted in FIG. 2 when the positive supply voltage, $V_{DD}$, is lower than a predetermined voltage threshold, $V_{TH}$, (e.g., the highest battery voltage when the voltage supply circuit 102 is a low-voltage battery). For example, the voltage supply circuit may be a low-voltage (LV) battery, for example, a primary coin cell or a silver-oxide battery having a voltage, $V_{BAT\_LV}$, less than or equal to 1.5V. During the operation depicted in FIG. 3, the primary low-voltage ladder circuit 220 of the POR circuit 206 is transformed into a primary low-voltage ladder circuit 320. Specifically, the PMOS transistor 244 in the primary low-voltage ladder circuit 220 is biased as a switch 344 when the positive supply voltage, $V_{DD}$, is lower than the voltage threshold, $V_{TH}$, (e.g., the highest battery voltage when the voltage supply circuit 102 is a low-voltage battery), for example, when the primary low-voltage ladder circuit 220 needs to detect an accurate trip level. When the PMOS transistor 244 in the primary low-voltage ladder circuit 220 is biased as the switch 344, the voltage, $V_{BIAS}$, is equal to $V_{SS}$.

Figure 4:
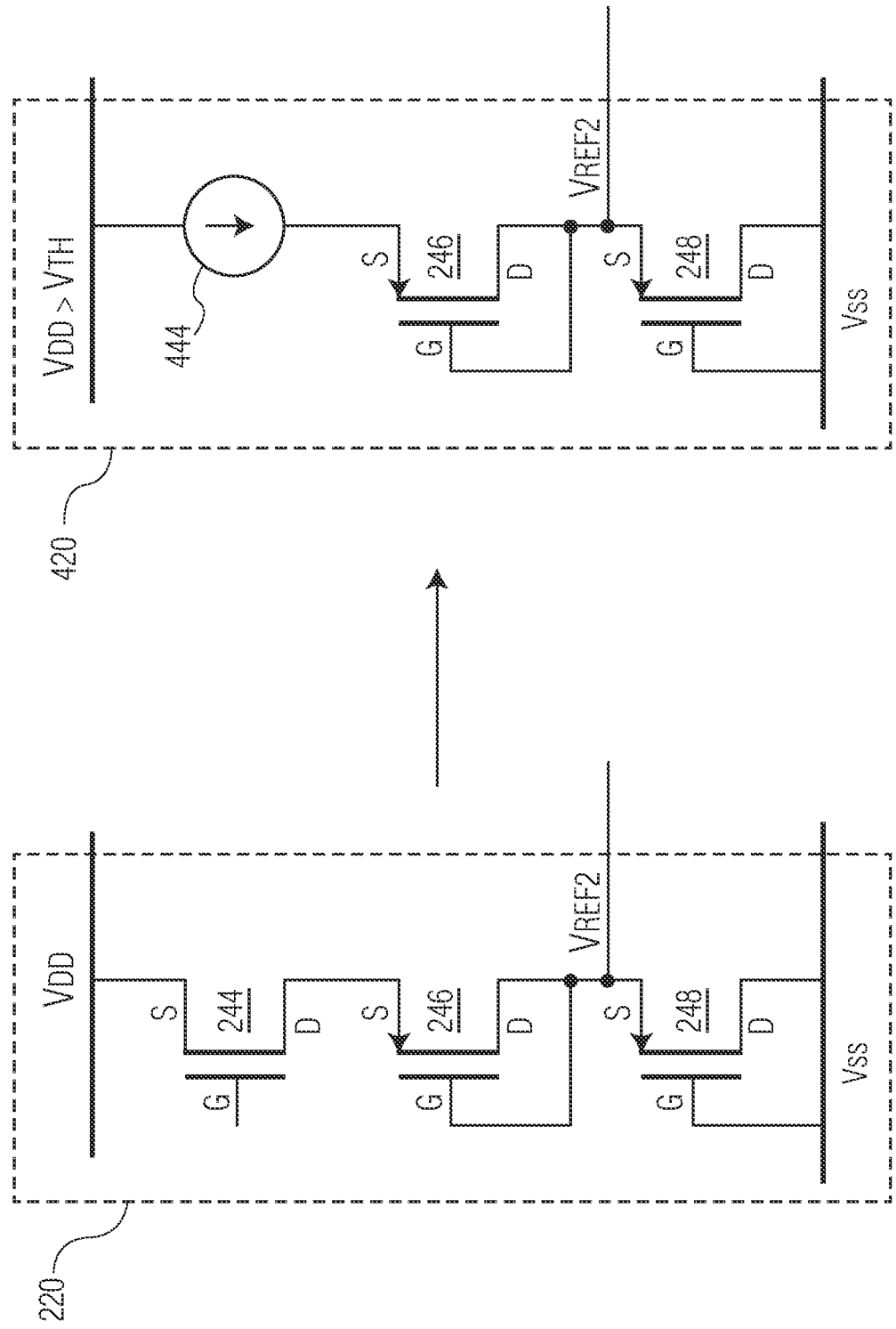
FIG. 4 depicts an operation of the POR circuit depicted in FIG. 2 when the positive supply voltage is higher than the predetermined voltage threshold.

FIG. 4 depicts an operation of the POR circuit 206 depicted in FIG. 2 when the positive supply voltage, $V_{DD}$, is higher than a predetermined voltage threshold, $V_{TH}$, (e.g., the highest battery voltage when the voltage supply circuit 102 is a low-voltage battery). For example, the voltage supply circuit may be a high-voltage (HV) battery, such as a Li-ion battery having a voltage, $V_{BAT\_HV}$, less than or equal to 3.6V. The trip level remains the same, for example, around 0.8V, which is detected by the primary low-voltage ladder circuit 220. Because a HV battery is connected, the voltage can rise further after tripping, while the supply voltage rises above 1.5V, the primary ladder current is limited. During the operation depicted in FIG. 4, the primary low-voltage ladder circuit 220 of the POR circuit 206 is transformed into a primary low-voltage ladder circuit 420. Specifically, the PMOS transistor 244 in the primary low-voltage ladder circuit 220 is biased as a current source 444 when the positive supply voltage, $V_{DD}$, is higher than the voltage threshold, $V_{TH}$, (e.g., the highest battery voltage when the voltage supply circuit 102 is a low-voltage battery). When the PMOS transistor 244 in the primary low-voltage ladder circuit 220 is biased as the current source 444, the voltage, $V_{BIAS}$, is equal to $V_{B2}$.

Figure 5:
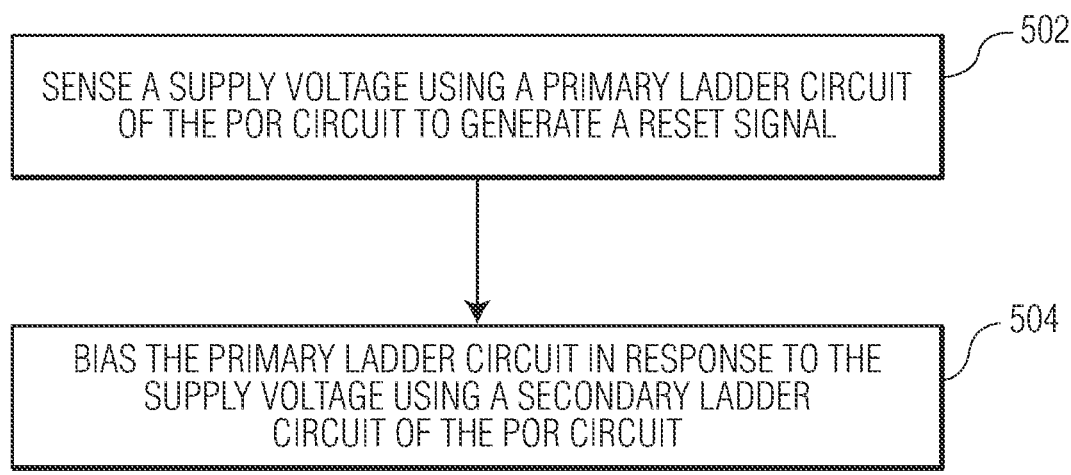
FIG. 5 is a process flow diagram of a method for operating a POR circuit in accordance with an embodiment of the invention.

FIG. 5 is a process flow diagram of a method for operating a POR circuit in accordance with an embodiment of the invention. The POR circuit may be similar to or the same as the POR circuit 106 depicted in FIG. 1, and/or the input supply circuit 206 depicted in FIG. 2. At block 502, a supply voltage is sensed, for example, reaching a first defined voltage trip level, using a primary ladder circuit of the POR circuit to generate a reset signal, for example, by generating a reference signal for the reset signal. At block 504, the primary ladder circuit is biased in response to the supply voltage, for example, reaching a second defined voltage trip level, using a secondary ladder circuit of the POR circuit. The primary ladder circuit may be similar to or the same as the low-voltage primary ladder circuit 220 depicted in FIG. 2, the low-voltage primary ladder circuit 320 depicted in FIG. 3, and/or the low-voltage primary ladder circuit 420 depicted in FIG. 4. The secondary ladder circuit may be similar to or the same as the high-voltage secondary ladder circuit 214 depicted in FIG. 2.

In the above description, specific details of various embodiments are provided. However, some embodiments may be practiced with less than all of these specific details. In other instances, certain methods, procedures, components, structures, and/or functions are described in no more detail than to enable the various embodiments of the invention, for the sake of brevity and clarity.

Although the operations of the method(s) herein are shown and described in a particular order, the order of the operations of each method may be altered so that certain operations may be performed in an inverse order or so that certain operations may be performed, at least in part, concurrently with other operations. In another embodiment, instructions or sub-operations of distinct operations may be implemented in an intermittent and/or alternating manner.

Alternatively, embodiments of the invention may be implemented entirely in hardware or in an implementation containing both hardware and software elements. In embodiments which use software, the software may include but is not limited to firmware, resident software, microcode, etc.

Although specific embodiments of the invention have been described and illustrated, the invention is not to be limited to the specific forms or arrangements of parts so described and illustrated. The scope of the invention is to be defined by the claims appended hereto and their equivalents.

What is claimed is:

1. A power-on reset (POR) circuit, the POR circuit comprising:
    a primary ladder circuit coupled to a supply voltage and configured to generate a reference signal for a reset signal in response to the supply voltage;
    a secondary ladder circuit coupled to the supply voltage and configured to bias the primary ladder circuit in response to the supply voltage;
    a reference circuit coupled to the supply voltage; and
    a comparator coupled to the supply voltage;
    wherein the comparator is configured to compare an output voltage of the secondary ladder circuit with a first voltage in the reference circuit to generate a comparison result signal.

2. The POR circuit of claim 1,
    wherein the secondary ladder circuit is configured to bias the primary ladder circuit as a current source when the supply voltage is higher than a voltage threshold.

3. The POR circuit of claim 1,
    wherein the secondary ladder circuit is configured to bias the primary ladder circuit as a switch when the supply voltage is lower than a voltage threshold.

4. The POR circuit of claim 1,
    wherein the primary ladder circuit comprises a first transistor coupled to the supply voltage and a plurality of diode-connected transistors coupled to the first transistor.

5. The POR circuit of claim 4,
    wherein the secondary ladder circuit is configured to bias the first transistor of the primary ladder circuit as a current source when the supply voltage is higher than a voltage threshold.

6. The POR circuit of claim 4,
    wherein the secondary ladder circuit is configured to bias the first transistor of the primary ladder circuit as a switch when the supply voltage is lower than a voltage threshold.

7. The POR circuit of claim 4,
    wherein the first transistor of the primary ladder circuit comprises a metal-oxide-semiconductor field-effect transistor (MOSFET) transistor or a bipolar junction transistor (BJT).

8. The POR circuit of claim 7,
    wherein the diode-connected transistors of the primary ladder circuit comprise a plurality of MOSFET transistors or a plurality of BJTs.

9. The POR circuit of claim 1,
    wherein the secondary ladder circuit comprises a plurality of diode-connected transistors.

10. The POR circuit of claim 9,
    wherein the diode-connected transistors of the secondary ladder circuit comprise a plurality of metal-oxide-semiconductor field-effect transistor (MOSFET) transistors or a plurality of bipolar junction transistors (BJTs).

11. The POR circuit of claim 1,
    further comprising a buffer circuit coupled to the supply voltage and between the comparator and the primary ladder circuit.

12. The POR circuit of claim 11,
    wherein the buffer circuit is configured to generate a buffered signal to a transistor of the primary ladder circuit based on the comparison result signal and a second voltage in the reference circuit.

13. A power-on reset (POR) circuit, the POR circuit comprising:
    a primary ladder circuit coupled between a first supply voltage and a second supply voltage and configured to generate a reference signal for a reset signal in response to the first supply voltage and the second supply voltage;
    a secondary ladder circuit coupled between the first supply voltage and the second supply voltage and configured to bias the primary ladder circuit in response to at least one of the first supply voltage and the second supply voltage;
    a reference circuit coupled to the first and second supply voltages;
    a comparator coupled to the first and second supply voltages; and
    a buffer circuit coupled to the first and second supply voltages and between the comparator and the primary ladder circuit.

14. A power-on reset (POR) circuit, the POR circuit comprising:

a primary ladder circuit coupled to a supply voltage and configured to generate a reference signal for a reset signal in response to the supply voltage reaching a first defined voltage trip level; and a secondary ladder circuit coupled to the supply voltage and configured to bias the primary ladder circuit in response to the supply voltage reaching a second defined voltage trip level.

\* \* \* \* \*